(12) United States Patent
Geusic et al.

(10) Patent No.: US 7,018,467 B2
(45) Date of Patent: Mar. 28, 2006

(54) THREE-DIMENSIONAL COMPLETE BANDGAP PHOTONIC CRYSTAL FORMED BY CRYSTAL MODIFICATION

(75) Inventors: Joseph E. Geusic, Berkeley Heights, NJ (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 10/053,003

(22) Filed: Jan. 17, 2002

(65) Prior Publication Data

US 2003/0131782 A1    Jul. 17, 2003

(51) Int. Cl.
    *C30B 1/10*    (2006.01)
(52) U.S. Cl. ............... 117/3; 117/84; 117/85; 117/86; 117/94; 117/95; 423/345; 389/322; 389/321
(58) Field of Classification Search ............ 117/3, 117/84, 85, 86, 94, 95; 423/345; 359/322, 359/321
    See application file for complete search history.

(56) References Cited

U.S. PATENT DOCUMENTS

| | | | |
|---|---|---|---|
| 5,471,180 A | 11/1995 | Brommer et al. ............ 333/202 |
| 5,526,449 A | 6/1996 | Meade et al. ............... 385/14 |
| 5,739,796 A * | 4/1998 | Jasper et al. ............... 343/895 |
| 5,999,308 A * | 12/1999 | Nelson et al. .............. 359/321 |
| 6,075,640 A * | 6/2000 | Nelson ....................... 359/107 |
| 6,139,626 A * | 10/2000 | Norris et al. ................ 117/68 |
| 6,423,613 B1 | 7/2002 | Geusic ....................... 438/455 |
| 6,436,187 B1 * | 8/2002 | Patel et al. .................. 117/68 |
| 6,452,713 B1 * | 9/2002 | White ......................... 359/322 |
| 6,542,682 B1 | 4/2003 | Cotteverte et al. .......... 385/125 |
| 6,582,512 B1 | 6/2003 | Geusic et al. ............... 117/3 |
| 6,630,713 B1 | 10/2003 | Geusic ....................... 257/347 |
| 2002/0062782 A1 * | 5/2002 | Norris et al. ................ 117/3 |
| 2002/0175330 A1 * | 11/2002 | Geusic et al. ............... 257/74 |

FOREIGN PATENT DOCUMENTS

| | | |
|---|---|---|
| EP | 1030196 | 8/2000 |
| EP | 1085352 | 3/2001 |
| JP | 2001-093887 | 4/2001 |
| WO | WO-98/35248 | 8/1998 |

OTHER PUBLICATIONS

John et al., "Photonic Bandgap Formation and Tunability i nCertin Self-Organizing Systems", journal of Lightwave Technology vol. 17., No. 11, Nov. 1999 pp. 1931-1943.*
Holland et al., "Synthesis of Macroporous Minerals with Highly Ordered THree Dimensional Arrays of Spheroidal Voids", Science vol. 281 Jul. 1998 pp. 538-540.*

(Continued)

*Primary Examiner*—Robert Kunemund
(74) *Attorney, Agent, or Firm*—Schwegman, Lundberg, Woessner & Kluth, P.A.

(57) ABSTRACT

A method of forming a three-dimensional (3D) complete photonic bandgap crystal by crystal modification is disclosed. The 3D crystal includes a first periodic array of unit cells formed from first voids connected by imaginary bonds. The first periodic array forms an incomplete bandgap. The first voids may be formed in any one of a number of shapes, including spherical. The 3D crystal further includes a second periodic array of second voids. The second voids are arranged along the imaginary bonds so as to modify each unit cell. The modification of the unit cells is designed to form a complete photonic bandgap.

58 Claims, 7 Drawing Sheets

OTHER PUBLICATIONS

Lin et al., "A Three Dimensional Optical Photonic Crystal", *Journal of Lightwave Technology* vol. 17 No. 11, Nov. 1999, 1944-1947.*

Birner, A. , et al., "Silicon-Based Photonic Crystals", *Advanced Materials, VCH Verlagsgesellschaft, Weinheim, De, 13*, (2001),377-388.

Blanco, A , et al., "Large-scale synthesis of a silicon photonic crystal with a complete three-dimensional bandgap near 1.5 micrometres", *Letters to Nature, 405*, (2000),437.

Ho, K , et al., "Existence of a Phototonic Gap in Periodic Dielectric Structures", *Physical Review Letters, 65*, (1990), 3152-3155.

Joannopoulos, J D., et al., "Photonic Crystals", Princeton University Press,(1995).

Mitsutake, K , et al., "Theoretical Study on the Formation Process of Empty Space in Silicon (ESS)", *2000 International Conference on Solid State Devices and Materials*, (2000),198-199.

Mizushima, I. , "Empty-Space-in-Silicon Technique for Fabricating a Silicon-on-Nothing Structure", *Applied Physics Letters, 77*, American Institute of Physics, NY,(2000), 3290-3292.

Nichols, F A., "Surface-(interace) and volume-diffusion contributions to morphological changes driven by capillarity", *Transactions of the American Institute of Mining, Metallurgical and Petroleum Engineers, 233(10)*, (1965), 1840-8.

Sato, T , "A new substrate engineering for the formation of empty space in silicon (ESS) induced by silicon surface migration", *International Electron Devices Meeting 1999. Technical Digest*, (1999),517-20.

Yablonovitch, E , *Phys. Rev. Lett., 58*, (1987),2059.

Yablonovitch, E , et al., *Phys. Rev. Lett., 67*, (1991),2295.

Birner, A , "Macroporous Silicon: A Two-Dimensional Photonic Bandgap Material Suitable for the Near-Infrared Spectral Range", *Physica Status Solidi A; 65(1)*, (Jan. 16, 1998),111-117.

Blanford, C F., "Gems of Chemistry and Physics: Macroporous Metal Oxides with 3D Order", *Advanced Materials, 13(6)*, (Mar. 2001).

Edrington, A C., "Polymer-Based Photonic Crystals", *Advanced Materials, 13(6)*, (Mar. 2001),421-425.

Jiang, P , "The Fabrication and Bandgap Engineering of Photonic Multilayers", *Advanced Materials, 13(6)*, (Mar. 2001),389-393.

Johnson, S G., "Guided modes in photonic crystal slabs", *Physical Review B (Condensed Matter), 60(8)*, (Aug. 15, 1999),5751-8.

Li, Z Y., "Photonic Bandgaps in Disordered Inverse-Opal Photonic Crystals", *Advanced Materials, 13(6)*, (Mar. 2001), 433-436.

Loncar, M , "Waveguiding in planar photonic crystals", *Applied Physics Letters, 77(13)*, (Sep. 25, 2000), 1937-1939.

Lu, Y , "Three-Dimensional Photonic Crystals with Non-sperical Colloids as Building Blocks", *Advanced Materials, 13(6)*, (Mar. 2001),415-420.

Manoharan, V N., "Photonic Crystals from Emulsion Templates", *Advanced Materials, 13(6)*, (Mar. 2001),447-450.

Miguez, H , "Synthesis and Photonic Bandgap Characterization of Polymer Inverse Opals", *Advanced Materials, 13(6)*, (Mar. 2001),393-396.

Ni, P , "Synthetic $SiO_2$ Opals", *Advanced Materials, 13(6)*, (Mar. 2001),437-441.

Norris, D J., "Chemical Approaches to Three-Dimensional Semiconductor Photonic Crystals", *Advanced Materials, 13(6)*, (Mar. 2001),371-376.

Smith, C J., "Low-loss channel waveguides with two-dimensional photonic crystal boundaries", *Applied Physics Letters, 77(18)*, (Oct. 30, 2000),2813-2815.

Subramania, G , *Advanced Materials, 13(6)*, Inverse Face-Centered Cubic Thin Film Photonic Crystals,(Mar. 2001), 443-446.

Tessier, P M., "Structured Metallic Films for Optical and Spectroscopic Applications via Colloidal Crystal Templating", *Advanced Materials, 13(6)*, (Mar. 2001),396-400.

Xia, Y , "Photonic Crystals", *Advanced Materials, 13(6)*, (Mar. 2001),369.

Xia, Y , "Self-Assembly Approaches to Three-Dimensional Photonic Crystals", *Advanced Materials, 13(6)*, (Mar. 2001), 409-413.

Yang, P , "Patterning Porous Oxides within Microchannel Networks", *Advanced Materials, 13(6)*, (Mar. 2001),427-431.

* cited by examiner

CUBIC P   CUBIC I   CUBIC F

TETRAGONAL P   TETRAGONAL I

ORTHORHOMBIC P   ORTHORHOMBIC C   ORTHORHOMBIC I   ORTHORHOMBIC F

MONOCLINIC P   MONOCLINIC C   TRICLINIC

TRIGONAL R   TRIGONAL AND HEXAGONAL P

THREE-DIMENSIONAL COMPLETE BANDGAP PHOTONIC CRYSTAL FORMED BY CRYSTAL MODIFICATION

CROSS-REFERENCE TO RELATED APPLICATIONS

This patent application is related to U.S. patent application Ser. No. 09/861,770 filed on May 22, 2001, and entitled "Method of forming three-dimensional photonic band structures in solid materials," which Patent Application is incorporated herein by reference, and is also related to U.S. Patent Application Ser. No. 10/052,952, co-filed with the present application on Jan. 17, 2002, and entitled "Three-dimensional photonic crystal waveguide structure and method," which Patent Application is incorporated herein by reference.

FIELD OF THE INVENTION

The present invention pertains to the formation of photonic crystals, and in particular relates to forming three-dimensional complete bandgap photonic crystals by crystal modification.

BACKGROUND OF THE INVENTION

The wave nature of electrons and the periodic lattice of atoms give rise to allowed energy bands and forbidden energy gaps for electrons in a solid. The forbidden gaps arise from the destructive interference of electrons for certain wavelengths and directions. If a forbidden gap exists for all possible directions, it is referred to as a complete bandgap. A semiconductor has a complete bandgap between the valence and conduction bands.

The optical analogy is the photonic crystal, where a periodic lattice of contrasting dielectric structures (i.e., different indices of refraction) provides the periodic potential for light that atoms do for electrons. Photonic crystals can be thought of as extensions of diffraction gratings (i.e., a one-dimensional photonic crystal) or naturally occurring crystals used in X-ray crystallography. Light interacting with a diffraction grating or X-ray crystal interacts with the periodic structure and is redistributed into "allowed" and precluded from "forbidden" directions. The forbidden directions are the "photonic bandgaps" of the structure.

Photonic crystals can be designed with photonic bandgaps that prevent light of a certain wavelength and direction from propagating within the photonic crystal. If the photonic crystal does not allow light to propagate within a wavelength range for all polarizations and directions, it is said to have a "complete photonic bandgap." A necessary condition for a complete photonic bandgap is that the contrasting dielectric lattice be periodic in three dimensions (3D).

Research of photonic crystals and their behavior was prompted by the article by Yablonovitch, entitled "Inhibited spontaneous emission in solid-state physics and electronics," in *Phys. Rev. Lett. Vol.* 58, No. 20, 2059–2062 (1987). Based on theoretical considerations, a number of new optical devices, from better lasers to extremely miniaturized light switches and guides, have been suggested by workers in this relatively new field.

While photonic crystals offer a great deal of promise in fabricating new devices, fabricating such crystals with predetermined structures is daunting. The article by Yablonovitch et al., entitled "Photonic band structure: the face-centered-cubic case employing nonspherical atoms," in *Phys. Rev. Lett.* Vol.67, No. 17,2295–2298 (1991), describes the formation of the first artificial 3D photonic crystal by drilling an array of intersecting millimeter size holes in a dielectric material. This photonic crystal has a bandgap in the microwave range of the spectrum and is of limited practical interest.

Since the early pioneering work by Yablonovitch, a great deal of research has been devoted to the fabrication and study of photonic crystals in the infrared and visible. The article by Bimer et al., entitled "Silicon-based photonic crystals," in *Adv. Mater.* Vol. 13, No. 6, Mar. 16, 2001, describes fabricating two-dimensional (2D) and 3D photonic crystals. 2D photonic crystals have periodicity in two dimensions and are uniform in the third dimension and are much easier to fabricate than 3D photonic crystals. Although a 2D photonic crystal can not have a complete bandgap in the strictest sense, it can have a forbidden gap that exists for all directions and polarizations of propagation precisely confined to the plane of periodicity. In this more limited sense, the forbidden gap is referred to as a "complete 2D bandgap."

While 2D photonic crystal waveguides are useful for certain applications such as planar circuits and distributed feedback (DFB) lasers, there are a host of other applications (e.g., the formation of ultra-small optical and electro-optical integrated circuits and devices) that call for 3D photonic crystal waveguides. To date, however, readily forming 3D photonic crystals waveguides has proven difficult. This is particularly true where the desired bandgap wavelength is at the optical or infrared, since the dimensions of the lattice must be a fraction of the bandgap wavelength.

One application for a 3D photonic crystal having a complete bandgap is to guide light. This can be accomplished by carving a path into such a photonic crystal to serve as an air-filled waveguide. Light that propagates in the air-filled waveguide at a frequency within the complete bandgap will be totally reflected by the photonic crystal and be totally confined to and directed along the waveguide. It should confine light around tight bends much better than conventional waveguides (e.g., optical fibers), where the guiding depends on the limited angular range of total internal reflection at the interface between the higher index core and the lower index cladding.

While some techniques have been developed for fabricating 3D photonic crystals, they involve extreme process conditions, such as forming individual dielectric layers and then stacking and bonding the layers to build the crystal. The formation of 3D waveguides in such crystals adds yet another level of complexity.

Whether a particular 3D photonic crystal has a complete or incomplete photonic bandgap depends on the particular lattice type and its parameters (e.g., the size, shape and spacing of the voids). Fortunately, the bandgap properties of a photonic crystal formed from a given lattice type (e.g., diamond) can be calculated. One technique for determining bandgap properties of a 3D photonic crystal based on the lattice parameters is presented in the article by Ho et al., entitled "Existence of a photonic gap in periodic dielectric structures," *Phys. Rev. Lett.*, Vol. 65, No. 25, 3152–3155 (1990), which article is incorporated by reference herein. The Ho article shows that certain crystals lattices (e.g., diamond) can form 3D photonic crystals having either a complete or incomplete bandgap, depending on the above-mentioned lattice parameters.

Given the increasing importance of 3D complete bandgap photonic crystals, it would be desirable to have a method of modifying the lattice of a incomplete bandgap 3D photonic crystal to form a complete bandgap 3D photonic crystal.

SUMMARY OF THE INVENTION

A three-dimensional (3D) complete bandgap crystal formed by crystal modification is shown. In one embodiment, the 3D crystal includes a first periodic array of unit cells formed from first voids connected by imaginary bonds. The first periodic array forms an incomplete bandgap. The first voids may be formed in any one of a number of shapes, including spherical. The 3D crystal further includes a second periodic array of second voids, with the second voids being arranged along the imaginary bonds so as to modify each unit cell. In one example, a single second void is arranged halfway between the first voids in the unit cell. In another example embodiment, the unit cell is a diamond unit cell. The modification of the unit cell (and hence the photonic crystal) is designed to form a complete photonic bandgap.

The present invention further includes a complete bandgap 3D photonic crystal product made by the process of forming a plurality of first voids in a substrate. The first voids are arranged in a periodic array of unit cells with imaginary bonds connecting the first voids in the unit cell. The first periodic array, taken by itself, forms an incomplete bandgap. The process further includes forming a plurality of second voids in the substrate. The second voids are formed at least one along one or more of the imaginary bonds in each unit cell so as to form a complete bandgap. In an example embodiment, the first and second voids are formed by surface transformation. In another example embodiment, the unit cells are formed as diamond unit cells, so that the addition of the second voids to the unit cells forms modified diamond unit cells.

The present invention also includes a method of forming a three-dimensional complete bandgap photonic crystal by crystal modification. The method includes forming a periodic array of unit cells in a substrate, wherein each unit cell consists of a plurality of first voids joined by imaginary bonds. The periodic array forms an incomplete bandgap. The method further includes forming one or more second voids along respective one or more of the imaginary bonds so as to modify each unit cell to create the complete photonic bandgap. In an example embodiment, the unit cell is formed as a diamond unit cell. In another example embodiment, the first and second voids are formed by surface transformation. In yet another example embodiment, the gap/mid-gap ratio may be calculated or empirically determined as a function of the filling ratio, and the filling ratio changed by the addition of the second voids to the point where a desired gap/mid-gap ratio is achieved.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

In the Figures, the first digit of the reference number corresponds to the Figure number. Accordingly, like elements in different Figures have reference numbers that differ only in the first digit that identifies the Figure number.

DETAILED DESCRIPTION OF THE PREFERRED EMBODIMENTS

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The term "substrate" as used in the following description includes any material, structure or combination of material/structure for which its optical, electronic, and acoustic properties, among others, can be modified by the formation or rearrangement of photonic energy bands in such material, structure, or combination thereof. Thus, the term "substrate" is understood as including, for example, linear and non-linear optical materials, metals, semiconductors and insulators/dielectrics, acoustic materials, magnetic materials, ferroelectric materials, piezoelectric materials, and superconducting materials, among others. In addition, the term "substrate" is understood as including substrates formed on silicon, silicon-on-insulator, doped and undoped semiconductors, epitaxial layers of silicon supported by a base semiconductor foundation, and other semiconductor structures. Further, when reference is made to a semiconductor "substrate" in the following description, previous process steps may have been utilized to form regions or junctions in the base semiconductor structure or foundation.

Forming a 3D Photonic Crystal by Surface Transformation

The present invention involves the formation of a complete bandgap 3D photonic crystal by modifying the lattice structure of an incomplete 3D photonic crystal. The complete bandgap 3D photonic crystal is formed from a periodic array of voids created in a solid substrate. One technique for creating such voids is called "surface transformation of empty spaces" (or "surface transformation," for short), which is described in detail in U.S. patent application Ser. No. 09/861,770, filed on May 22, 2001, and entitled "Method of forming three-dimensional photonic band structures in solid materials," which Patent Application is commonly assigned, has a common inventor and as mentioned above, is incorporated herein by reference.

Figure 1:
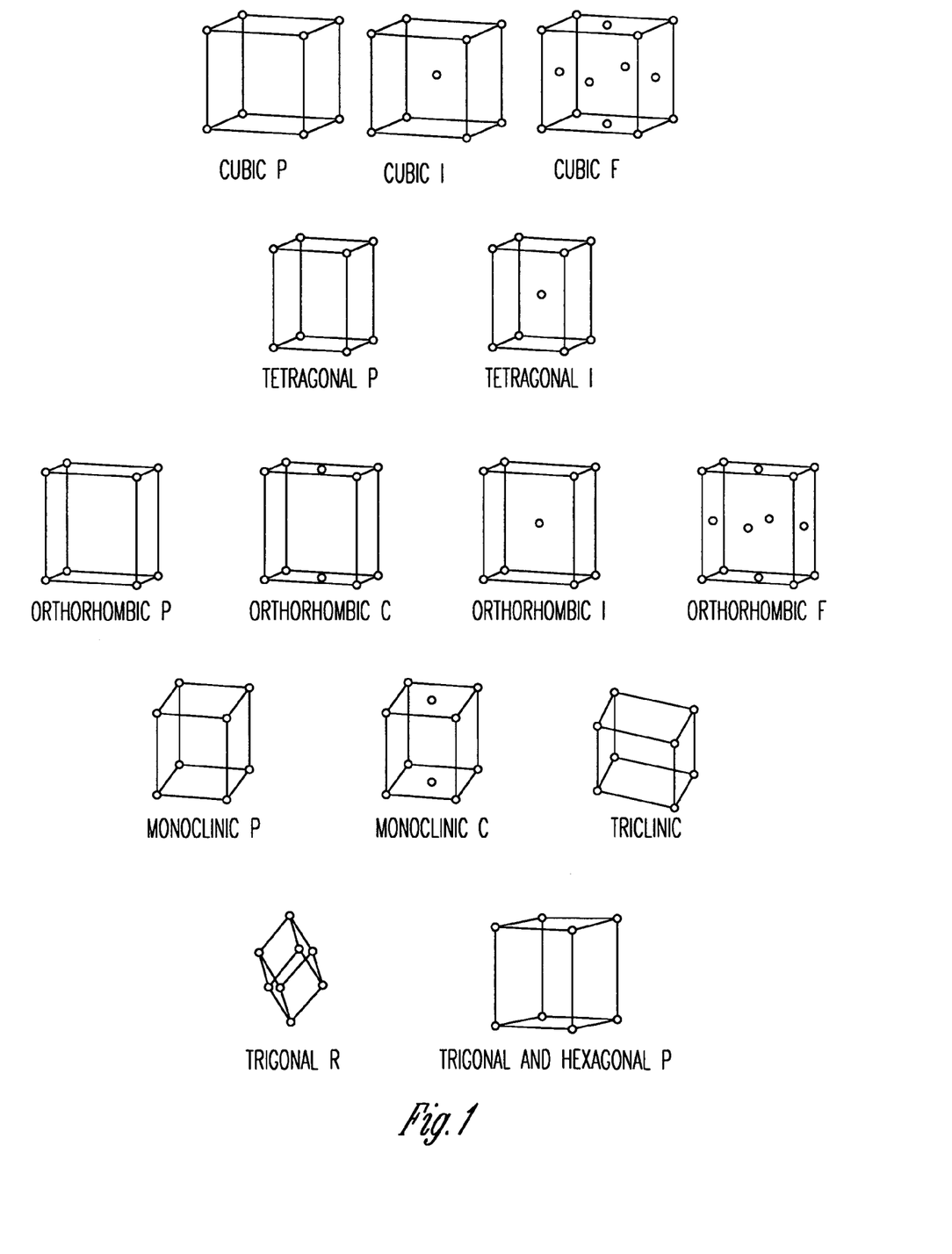
FIG. 1 illustrates fourteen representative unit cells with voids as "atoms," as examples of unit cells that can be used as a basis for forming a 3D photonic crystal.

Using the surface transformation technique, a 3D photonic crystal of any lattice symmetry can be fabricated. According to the teachings of the present invention, any one of a number of space group symmetries can be formed in a substrate of virtually any solid material by surface transformation, to control its optical and electromagnetic properties. The space group symmetries include a plurality of voids formed in the substrate by drilling holes to a predefined depth and at a predefined lattice position, and then heating the material at a temperature close to the melting point of the substrate material, to spontaneously form void patterns at the desired lattice position. The voids may have various geometries (e.g., spherical, cylindrical, plate-like, etc.) and may be formed at different periodicities and in a variety of space group symmetries using, for example, the representative unit cells of FIG. 1, which are described by C. Kittel in *Introduction to Solid State Physics*, J. Wiley & Sons, 3d Ed., (1966).

As a general rule, the wavelength of the photonic bandgap is about twice the period (i.e., lattice constant $a_0$) of the photonic crystal. Thus, to achieve a bandgap for a desired wavelength (e.g., x-ray, ultraviolet, visible, infrared, microwave, etc.), the lattice constant $a_0$ should be a fraction of the desired wavelength. Where the substrate is a crystal, the bandgap can occur at certain phonon wavelengths, which are quantized lattice vibrations that occur at multiples of the lattice constant of the substrate crystal. The wavelength and width of the photonic bandgap also depend on the filling ratio, which is the ratio of the volume of the voids in the unit cell to the total volume of the unit cell.

According to the teaching of the present invention, by properly selecting the lattice constant $a_0$ and the "atom" (i.e., void) shape and size, a variety of 3D photonic crystals and thus 3D photonic crystal waveguide structures can be produced for the wavelength region of interest. The lower bound of the photonic bandgap wavelength is determined mainly by the smallest lattice constant $a_0$ and voids that can be formed in the particular substrate.

As mentioned above, certain 3D photonic crystals formed with certain space group symmetries and voids of a given size and/or shape may not provide the necessary complete photonic bandgap at one filling ratio but may do so at another. Thus, the present invention includes a method of modifying the lattice structure of a 3D photonic crystal with an incomplete bandgap to form a crystal with a complete bandgap.

In the article by Ho et al. referenced above, the photonic band structure of the diamond lattice for air spheres (i.e., spherical voids) of various sizes in a dielectric background is calculated. Ho et al. have identified the conditions under which a complete bandgap exists for a diamond lattice of spherical voids. The technique of Ho et al. is applicable to other lattice types as well.

Figure 2A:
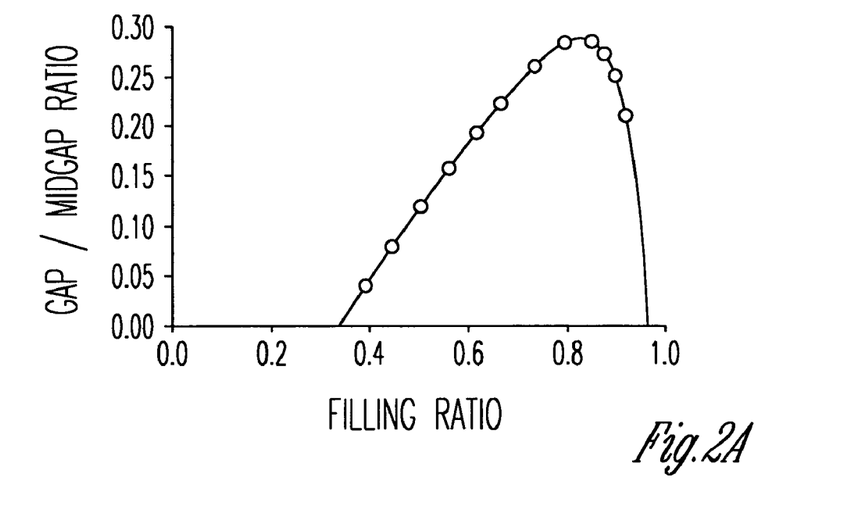
FIG. 2A is a plot adapted from the article by Ho et al. that plots the gap/mid-gap ratio as a function of the filling ratio for a diamond crystal structure comprising air spheres formed in a solid dielectric substrate having a refractive index of 3.6.

FIG. 2A is adapted from the article by Ho et al. (FIG. 3(a) therein), and plots the "gap/mid-gap ratio" versus the filling ratio for the diamond lattice of air spheres formed in a solid substrate. The gap/mid-gap ratio is the ratio of the size of the calculated bandgap (in units of frequency) of the diamond crystal normalized to the mid-gap frequency. From FIG. 2A, it can be seen that a filling ratio of about 0.35 or greater is required to achieve a complete bandgap. Further, the gap/mid-gap ratio grows until a filling ratio of about 0.8 is reached, at which point the gap/mid-gap ratio decreases rapidly.

Figure 2B:
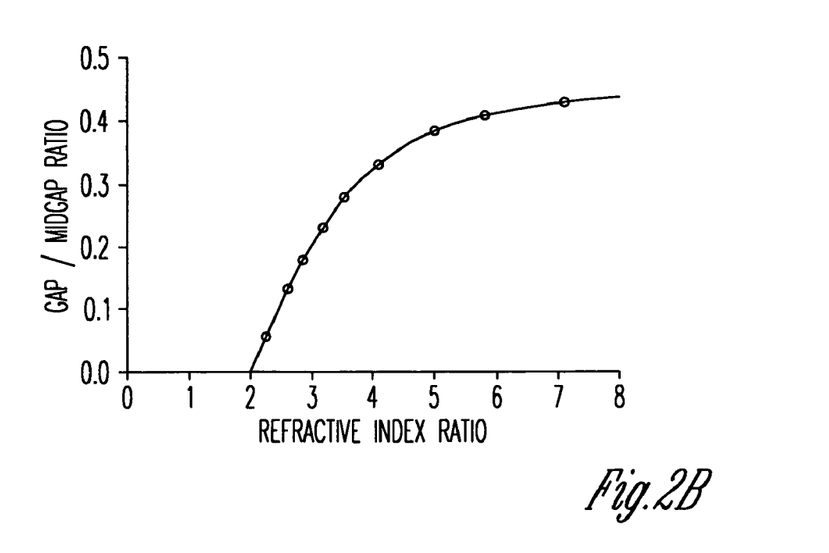
FIG. 2B is a plot adapted from the article by Ho et al. that plots the gap/mid-gap ratio as a function of the refractive index contrast (ratio) between air spheres and the refractive index of the substrate, for a diamond crystal structure comprising air spheres wherein the filling ratio is 81%.

FIG. 2B is a plot adapted from the article by Ho et al. (FIG. 3(b) therein) that plots the gap/mid-gap ratio as a function of the refractive index contrast (ratio) between air spheres and the refractive index of the substrate. The air spheres are arranged in a diamond crystal structure with a filling ratio of 81%. For this filling ratio, the refractive index of the substrate needs to be greater than about 2. Further, the larger the refractive index ratio, the larger the gap/mid-gap ratio.

3D Photonic Crystal Diamond Lattice

Figure 3A:
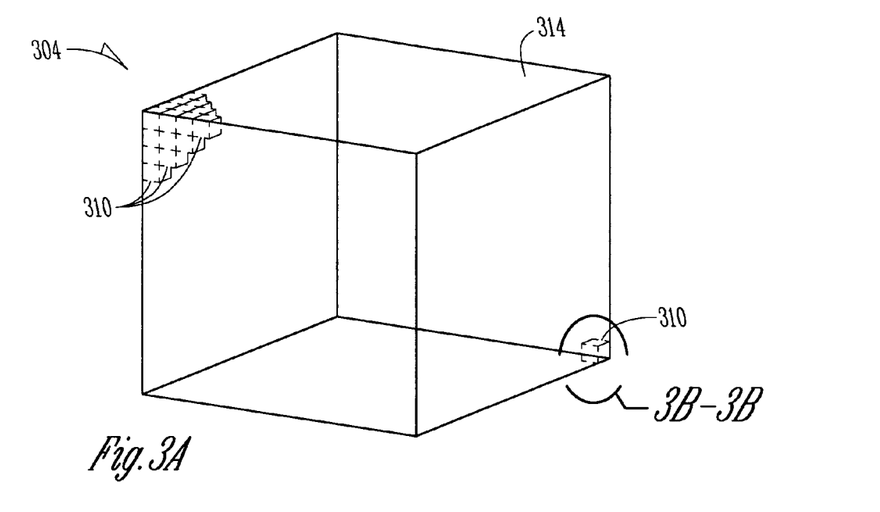
FIG. 3A is an isometric view of a photonic crystal made up an array of diamond unit cells formed in a substrate.
Figure 3B:
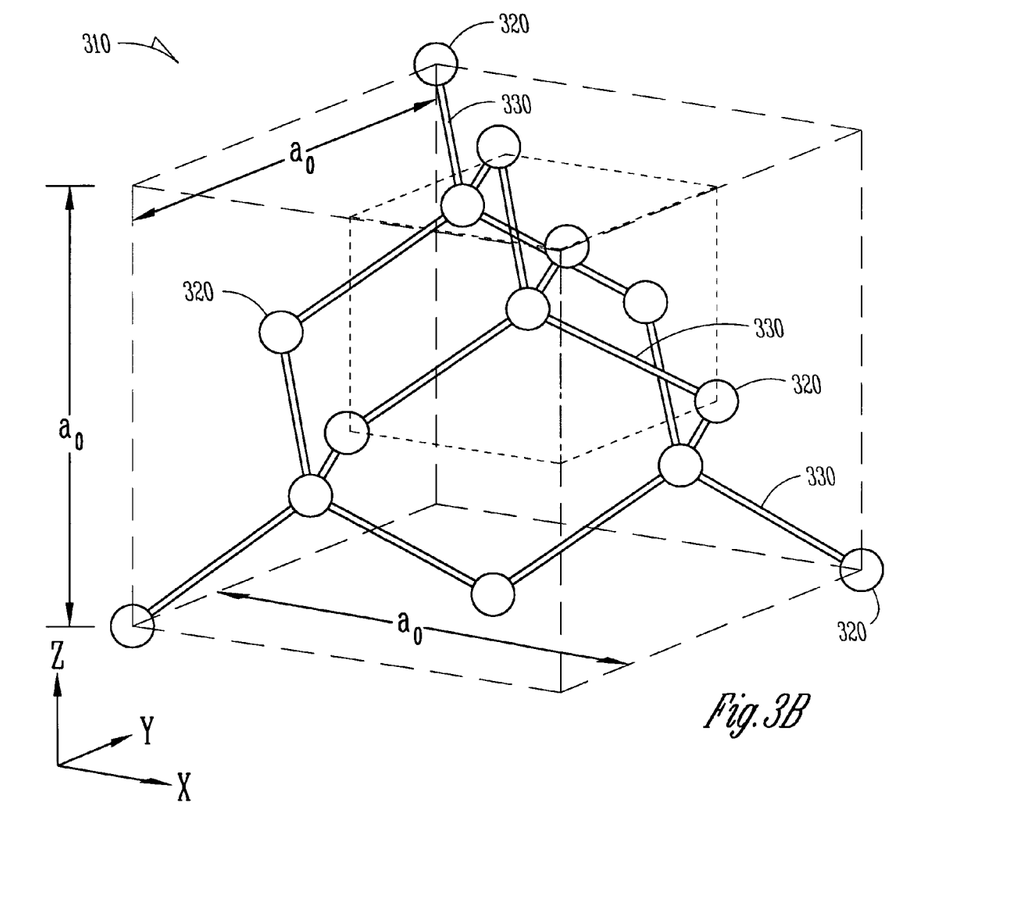
FIG. 3B illustrates one of the diamond unit cells used to form the photonic crystal of FIG. 3A, wherein each diamond unit cell is formed from spherical void "atoms" created in solid substrate, where the "atoms" are linked by imaginary tetrahedral "bonds"
Figure 3C:
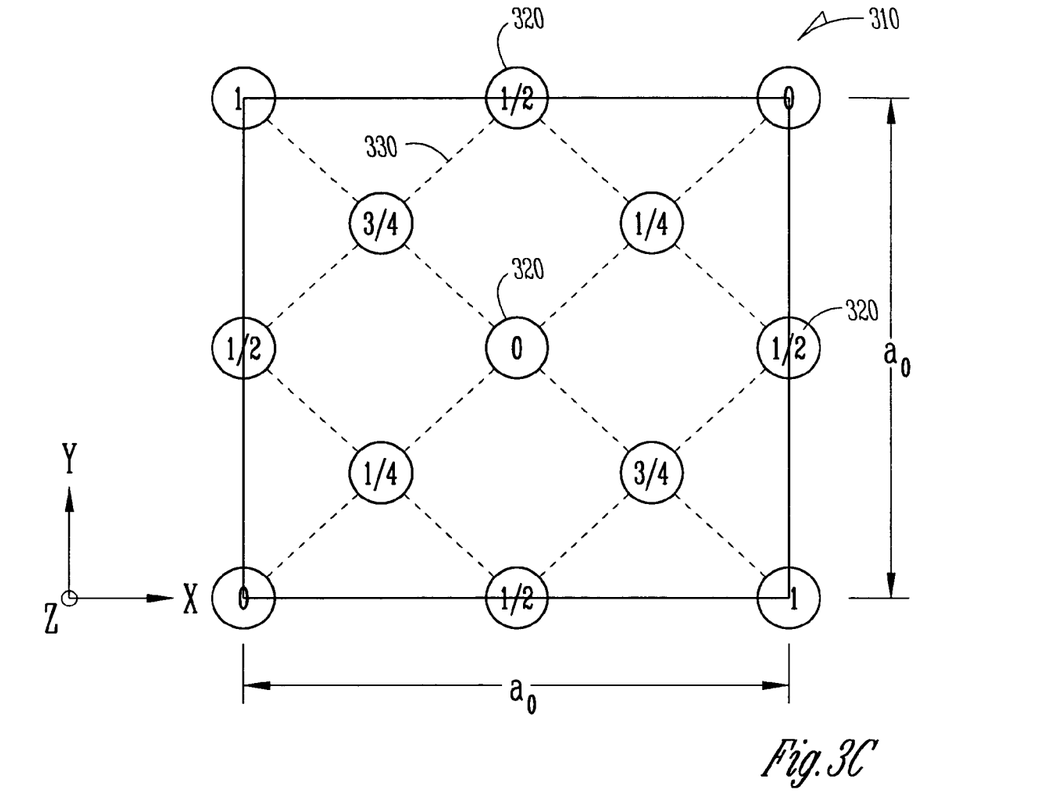
FIG. 3C is a diagram representing the spherical void positions in the diamond unit cell of FIG. 3B as projected on a cube face, with the fractions denoting the height above the base in lattice constant ($a_0$) units.

FIG. 3A is an isometric view of a photonic crystal 304 made up of an array of diamond unit cells 310 formed in substrate 314. The detailed structure of diamond unit cell 310 is illustrated in FIGS. 3B and 3C. Each diamond unit cell 310 is made up of spherical voids 320 formed in a substrate 314, and has a lattice constant $a_0$. Voids 320 may be any shape. However, spherical voids are considered herein as an example for the sake of discussion. Spherical voids 320 are connected by imaginary tetrahedral "bonds" 330. It is assumed below for the sake of illustration that substrate 314 is silicon (optical index, n=3.6), with the x and y axes in the plane of the substrate and the z-axis normal to the substrate plane. It is further assumed, as an example embodiment, that spherical voids 320 are formed by surface transformation. Thus, photonic crystal 304 is made up of a periodic array of voids 320 as defined by unit cells 310. The periodic array so formed has an incomplete bandgap.

Figure 4:
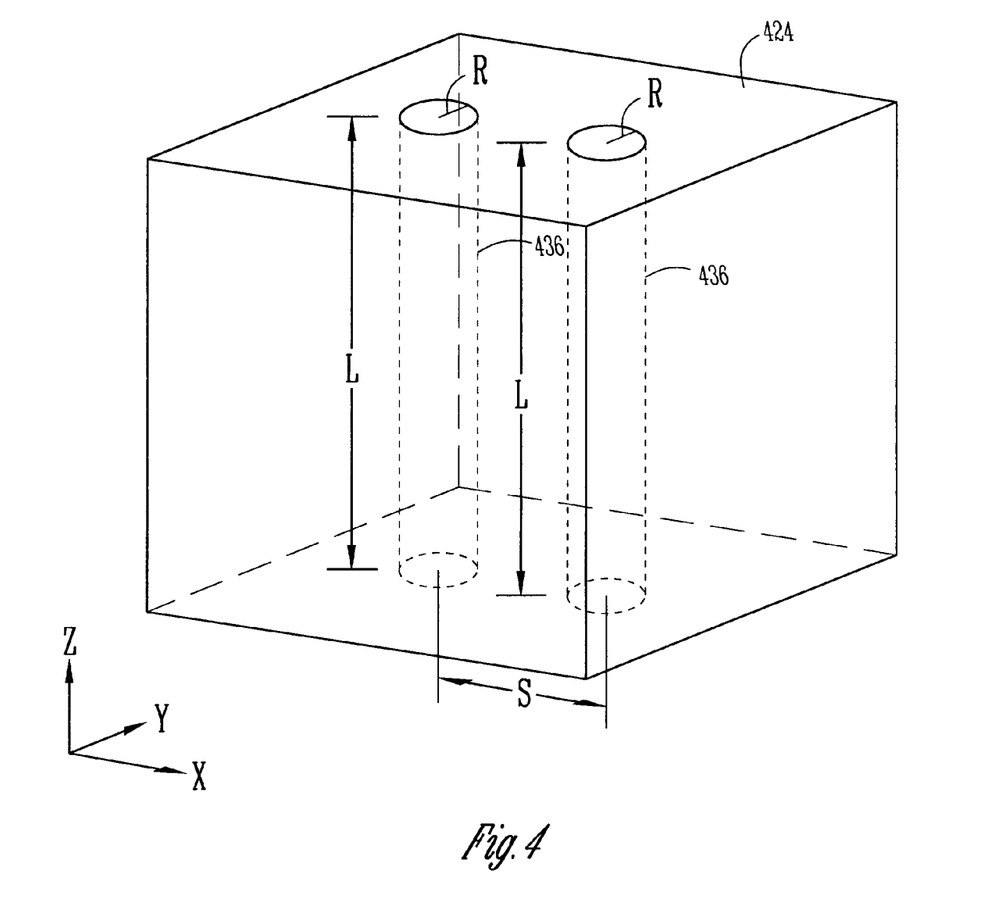
FIG. 4 is a perspective view of a substrate having formed therein cylindrical holes of a select length L, radius R and spacing S prior to forming spherical voids via surface transformation.

As illustrated in FIG. 4, the process of forming a 3D photonic crystal by surface transformation involves drilling into substrate 424 a defined set of cylindrical holes 436 having a specific radius R, depth L and separation S (e.g., equal to lattice constant $a_0$), and then annealing the substrate. Drilling can be done by either reactive ion etching or with a real drill bit. It will be understood that the method described below can be applied to forming complete photonic bandgaps in other high index (n>2) substrates such as GaAs, InP, etc., by modifying the annealing conditions.

For simplicity, the formation of one unit cell in (x,y) and N unit cells in the Z-direction is described. To form additional unit cells in the (x,y) plane, repeated translation of the hole pattern, modulo $a_0$, in the x and y directions is all that is required.

To create spherical voids with a lattice periodicity $a_0$ in the z-direction into the substrate requires that the radius of the cylindrical holes must be:

$$R = a_0/8.89 \sim 0.11 a_0.$$

After surface transformation, the radius $R_S$ of each spherical void 20 is:

$$R_S = (1.88/8.99) a_0 \sim 0.212 a_0$$

The depth L of the initial cylindrical holes required to form by surface transformation each unit cell and the spherical void lattice sites at (x,y,z) for the N unit cells in the z-direction are:

(a) For unit cell sites (1,0,1) and (0,1,1):

$$L_1 = (N) a_0 = (N)\, 8.89 R$$

(b) For (¾,¼,¾) and (¼,¾,¾):

$$L_{3/4} = (N+¼) a_0$$

(c) For (½,0,½), (0,½,½), (1,½,½) and (½,1,½):

$$L_{1/2} = (N+½) a_0$$

The two lattice points (1,½,½) and (½,1,½) are actually in the next adjacent x-translated and y-translated unit cells, respectively. They are given to be consistent with FIGS. 3A and 3B, but are omitted when translating the unit cell in the x and y direction modulo $a_0$.

(d) For (¼,¼,¼) and (¾,¾,¼):

$$L_{1/4} = (N+¾) a_0$$

(e) For (0,0,0), (½,½,0) and (1,1,0):

$$L_0 = (N+1) a_0$$

During annealing (e.g., at 1100° C. in a 10 torr atmosphere of hydrogen), spherical voids 320 form in silicon substrate 314 at each of the lattice sites in the vertically stacked N unit cells 310, as depicted in FIGS. 3B and 3C.

Since the nearest neighbors in diamond unit cell (lattice) 310 are 0.433 $a_0$ distant along the directions of tetrahedral bonds 330 and the spherical void radius $R_S$ is 0.21 $a_0$, the surface transformation formed diamond unit cell has a filling ratio of only 0.32.

With reference again to the plot of FIG. 2A, it can be seen that the filling ratio of 0.32 is not sufficient to produce a complete bandgap (i.e., at a filling ratio of 0.32, the gap size is zero). According to the teaching of the present invention and as explained in more detail below in connection with FIG. 5, when the filling ratio can be increased to about 0.35 or greater, then a complete bandgap can be achieved.

Modification of the Crystal Lattice

Figure 5A:
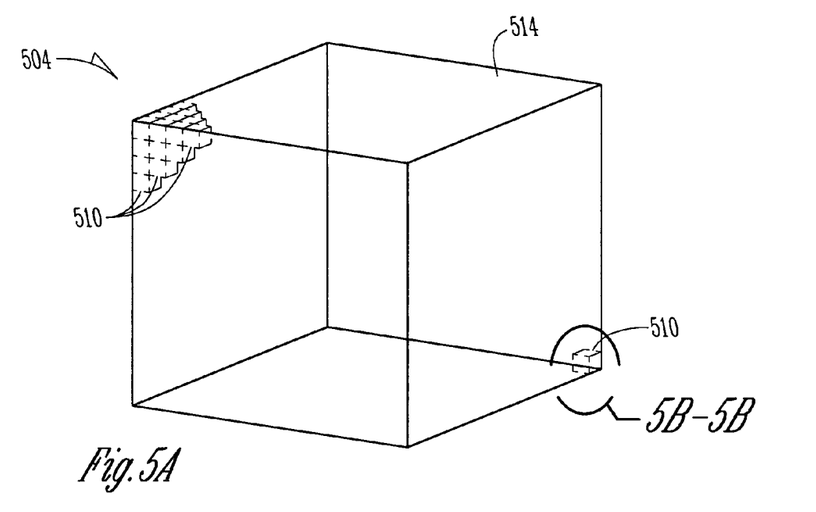
FIG. 5A is an isometric view of a photonic crystal made up an array of modified diamond unit cells formed in a substrate.
Figure 5B:
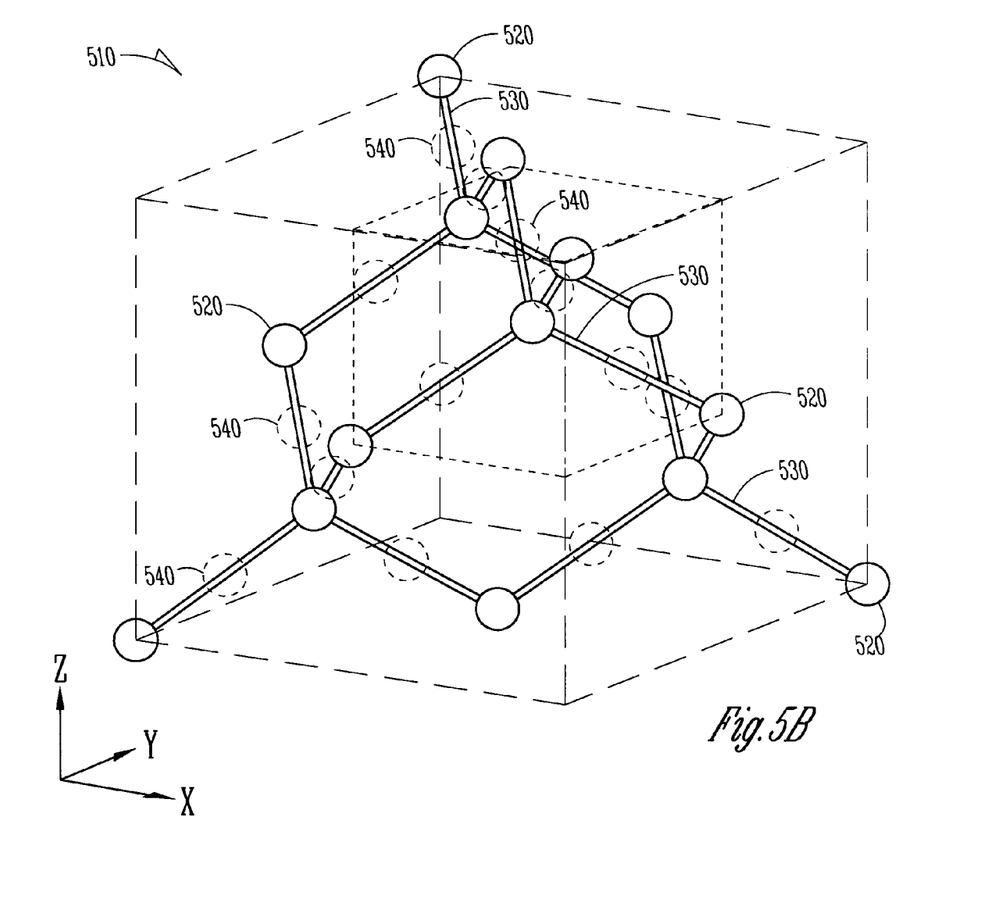
FIG. 5B illustrates one of the modified diamond unit cells used to form the photonic crystal of FIG. 5A, wherein the modified diamond unit cell is formed by modifying the diamond unit cell of FIG. 3B by forming additional voids halfway between the existing voids along the tetrahedral bonds.
Figure 5C:
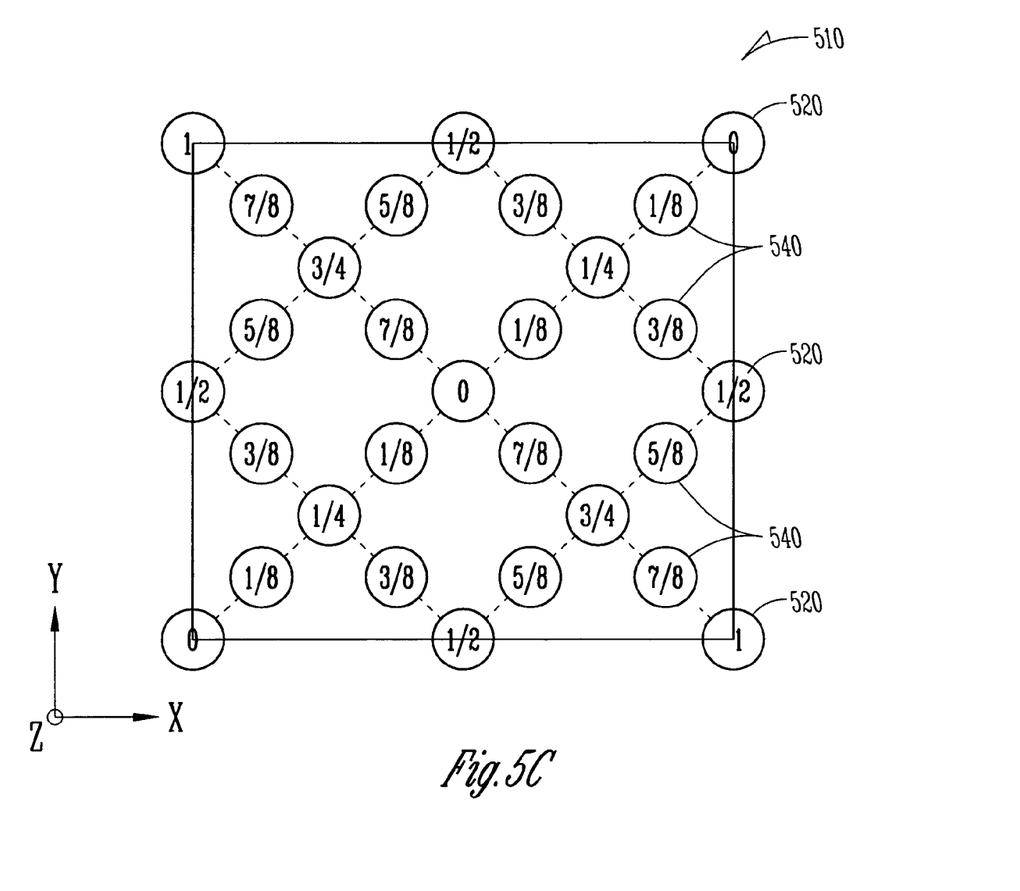
FIG. 5C is the same plot as FIG. 3C, but represents the modified diamond unit cell of FIG. 5B.

FIG. 5A is an isometric view of a complete bandgap photonic crystal 504 made up of unit cells 510 formed in substrate 514. With reference to FIGS. 5B and 5C, each unit cell 510 includes spherical voids 520 connected by tetrahedral bonds 530 that form a diamond unit cell identical to unit cell 310 of FIG. 3B. However, unit cell 510 is further modified to include additional spherical voids 540 of radius $0.212 a_0$ at a point halfway along each tetrahedral bond 530. Spherical voids 540 do not alter the diamond symmetry, yet they increase the filling ratio to 0.48, resulting in a complete bandgap with a gap/mid-gap ratio of about 0.1. The unit cell 510 shown in detail FIGS. 5B and 5C is referred to herein as a "modified diamond unit cell" or a "modified diamond crystal."

The depth L of the initial cylindrical hole required to form by surface transformation spherical voids 520 and 540 at each unit cell lattice location at (x,y,z) for the N modified unit cells in the z-direction are:

(A) For lattice sites (1,0,1) and (0,1,1)

$$L_1 = (N) a_0$$

(B) For (⅞,⅛,⅞), (⅝,⅜,⅞), (⅜,⅝,⅞) and (⅛,⅞,⅞)

$$L_{7/8} = (N+⅛) a_0$$

(C) For (¾,¼,¾) and (¼,¾,¾)

$$L_{3/4} = (N+¼) a_0$$

(D) For (⅝,⅛,⅝), (⅞,⅜,⅝), (⅛,⅝,⅝) and (⅜,⅞,⅝)

$$L_{5/8} = (N+⅜) a_0$$

(E) For (½,0,½), (0,½,½), (1,½,½), and (½,1,½)

$$L_{1/2} = (N+½) a_0$$

As before, lattice sites (1,½,½) and (½,1,½) are actually in the next unit adjacent x-translated and y-translated unit cells respectively. They are given to be consistent with FIGS. 5B and 5C but need to be omitted when translating the unit cell in the x and y direction modulo $a_0$.

(F) For (⅜,⅛,⅜), (⅛,⅜,⅜), (⅞,⅝,⅜) and (⅝,⅞,⅜)

$$L_{3/8} = (N+⅝) a_0$$

(G) For (¼,¼,¼), and (¾,¾,¼)

$$L_{1/4} = (N+¾) a_0$$

(H) For (⅛,⅛,⅛), (⅜,⅜,⅛), (⅝,⅝,⅛) and (⅞,⅞,⅛)

$$L_{1/8} = (N+⅞) a_0$$

(I) For (0,0,0), (½,½,0) and (1,1,0)

$$L_0 = (N+1) a_0$$

Annealing (e.g., at 1100° C. and in a 10 torr hydrogen atmosphere) substrate 514 with the above-defined pattern of cylindrical holes produces spherical voids 520 at the apexes of the tetrahedral bonds 530 and spherical voids 540 halfway between spherical voids 520 along the tetrahedral bonds 530 in the vertically stacked N unit cells of the modified diamond lattice, as depicted in FIGS. 5B and 5C.

The annealing time required to form N (z-stacked) unit cells can be estimated using, for example, the approach described in the paper by Matsutake and Ushiku, presented in the Extended Abstracts of the "2000 International Conference on Solid State Devices and Materials," Tokyo, Japan, pp. 198–199 (2000). For $a_0 \sim 1$ micron and hence $R \sim 0.1$ micron, the annealing time (in seconds) for formation of N (z-stacked) unit cells is estimated to be $\sim N \times 40$.

Although the formation of a complete bandgap 3D crystal lattice from incomplete bandgap crystal lattice has been described in connection with modifying a diamond lattice of spherical voids formed in a silicon substrate, the method applies generally to modifying any incomplete bandgap crystal lattice. In one embodiment of the present invention, the method described in the article by Ho et al. is employed to determine whether a particular crystal structure will have a complete bandgap and if not, if the crystal structure can be modified to produce a complete bandgap. In another embodiment, whether a particular crystal structure will yield a complete bandgap, or whether a particular crystal structure can be modified to achieve a complete bandgap is determined empirically.

CONCLUSION

The present invention is a complete bandgap 3D photonic crystal formed by crystal modification. The crystal is formed in a substrate and is made up of a first periodic array of unit cells of voids connected by imaginary bonds. The first periodic array by itself does not produce a complete bandgap. However, by determining (e.g., via calculation or empirical study) the bandgap properties of the crystal based on the first periodic array of voids, it is possible to modify the crystal structure of the first periodic array (e.g., by increasing the filling ratio) is modified to achieve a complete photonic bandgap. In the invention, second voids are added to the unit cells of the crystal to modify the crystal and create the complete bandgap. This approach allows for a wide variety of different complete bandgap 3D photonic crystals to be formed, with the complete bandgaps having wavelengths ranging from the very small (e.g., ultraviolet and below) to the relatively large (infrared and above).

All publications, patents and patent applications are incorporated herein by reference. While in the foregoing specification, this invention has been described in relation to certain preferred embodiments thereof, and many details have been set forth for purposes of illustration, it will be apparent to those skilled in the art that the invention is susceptible to additional embodiments and that certain of the details herein may be varied considerably without departing from the basic principles of the invention.

What is claimed is:

1. A complete bandgap 3D photonic crystal, comprising:
   a first periodic array of unit cells formed in a substrate from first voids connected by imaginary bonds, wherein the first voids are completely separated from each other by a first portion of the substrate, and wherein the first periodic array alone forms an incomplete bandgap; and
   a second periodic array of second voids, wherein the second voids are completely separated from each other by a second portion of the substrate and completely separated from the first voids by a third portion of the substrate, wherein each second void is arranged along one of the imaginary bonds so as to modify each unit cell to form a complete photonic bandgap.

2. The photonic crystal of claim 1, wherein the unit cell is a diamond unit cell.

3. The photonic crystal of claim 1, wherein the first voids are spherical.

4. The photonic crystal of claim 3, wherein the second voids are spherical.

5. The photonic crystal of claim 4, wherein the first and second voids are substantially the same size.

6. The photonic crystal of claim 1, wherein a single second void is arranged halfway between the first voids in the unit cell.

7. The photonic crystal of claim 1, wherein two or more of the second spherical voids lie along each imaginary bond.

8. The photonic crystal of claim 1, wherein the substrate includes a material selected from the group of materials consisting of a linear optical material, a non-linear optical material, a metal, a semiconductor, an insulator, a dielectric, an acoustic material, a magnetic material, a ferroelectric material, a piezoelectric material, and a superconducting material.

9. A complete bandgap 3D photonic crystal, comprising:
   a first periodic array of diamond unit cells formed in a substrate from first voids connected by imaginary bonds, wherein the first voids are completely separated from each other by a first portion of the substrate, and wherein the first periodic array forms an incomplete bandgap; and
   a second periodic array of second voids, wherein the second voids are completely separated from each other by a second portion of the substrate and completely separated from the first voids by a third portion of the substrate, and wherein each second void is arranged along one of the imaginary bonds so as to modify each diamond unit cell to form a complete photonic bandgap.

10. The photonic crystal of claim 9, wherein the first voids are spherical.

11. The photonic crystal of claim 10, wherein the second voids are spherical.

12. The photonic crystal of claim 11, wherein the first and second voids are substantially the same size.

13. The photonic crystal of claim 9, wherein a single second void is arranged halfway between the first voids in the unit cell.

14. The photonic crystal of claim 9, wherein two or more of the second voids are arranged along each imaginary bond.

15. The photonic crystal of claim 9, wherein the substrate includes a material selected from the group of materials consisting of a linear optical material, a non-linear optical material, a metal, a semiconductor, an insulator, a dielectric, an acoustic material, a magnetic material, a ferroelectric material, a piezoelectric material, and a superconducting material.

16. A complete bandgap 3D photonic crystal comprising:
   a periodic array of unit cells formed in a substrate, wherein each unit cell consists of a plurality of first voids joined by imaginary bonds, wherein the first voids are completely separated from each other by a first portion of the substrate, and wherein the periodic array forms an incomplete bandgap; and
   one or more second voids formed along respective one or more of the imaginary bonds so as to modify each unit cell to create the complete photonic bandgap, wherein the second voids are completely separated from each other by a second portion of the substrate and completely separated from the first voids by a third portion of the substrate.

17. The photonic crystal of claim 16, wherein the first periodic array of voids has an associated filling ratio, and the one or more second voids are sized to substantially increase the filling ratio.

18. The photonic crystal of claim 16, wherein at least one of the first and second voids are spherical.

19. The photonic crystal of claim 16, wherein the unit cells are diamond unit cells.

20. The photonic crystal of claim 16, wherein a single second void is arranged halfway between the first voids in the unit cell.

21. The photonic crystal of claim 16, wherein two or more of the second voids are arranged along each imaginary bond.

22. The photonic crystal of claim 16, wherein the substrate includes a material selected from the group of materials consisting of a linear optical material, a non-linear optical material, a metal, a semiconductor, an insulator, a dielectric, an acoustic material, a magnetic material, a ferroelectric material, a piezoelectric material, and a superconducting material.

23. A three-dimensional photonic crystal, comprising:
   a periodic array of diamond unit cells each consisting of a plurality of first voids formed in a substrate with a refractive index, the first voids connected by imaginary tetrahedral bonds, wherein the first voids are completely separated from each other by a first portion of the substrate;
   a plurality of second voids, with at least one second void formed along one of the imaginary tetrahedral bonds, wherein the second voids are completely separated from each other by a second portion of the substrate and completely separated from the first voids by a third portion of the substrate; and wherein the plurality of first voids has an associated filling ratio that in combination with the substrate refractive index results in an incomplete bandgap, and wherein the second plurality of voids increases the filling ratio so as to form a complete bandgap.

24. The photonic crystal of claim 23, wherein the first and second voids are formed in the substrate by surface transformation.

25. The photonic crystal of claim 23, wherein the first and second voids are spherical voids.

26. The photonic crystal of claim 23, wherein the complete bandgap has a wavelength that includes one of x-ray, ultraviolet, visible, infrared and microwave.

27. The photonic crystal of claim 23, wherein the complete bandgap includes phonon wavelengths.

28. The photonic crystal of claim 23, wherein a single second void is arranged halfway between each of the first voids in each diamond unit cell.

29. A three-dimensional photonic crystal product formed by the process of:

forming a plurality of first voids in a substrate, including arranging the first voids in a period array of unit cells with imaginary bonds connecting the first voids in the unit cell, such that the period array has an incomplete bandgap, wherein the first voids are completely separated from each other by a first portion of the substrate; and forming a plurality of second voids in the substrate along at least one of the imaginary bonds in each unit cell so as to form a complete bandgap, wherein the second voids are completely separated from each other by a second portion of the substrate and completely separated from the first voids by a third portion of the substrate.

30. The photonic crystal product of claim 29, wherein the process includes forming the pluralities of first and second voids by surface transformation.

31. The photonic crystal product of claim 29, wherein the process includes forming the unit cells as diamond unit cells.

32. The photonic crystal product of claim 29, wherein the process includes forming at least one of the first and second voids as spherical voids.

33. The photonic crystal product of claim 29, wherein the process includes selecting a substrate that includes a material selected from the group of materials consisting of a linear optical material, a non-linear optical material, a metal, a semiconductor, an insulator, a dielectric, an acoustic material, a magnetic material, a ferroelectric material, a piezoelectric material, and a superconducting material.

34. The photonic crystal product of claim 29, wherein the periodic array of first voids has an associated filling ratio, and wherein the process includes forming the second voids in the substrate to substantially increase the filling ratio.

35. The photonic crystal product of claim 34, wherein the process includes calculating a gap/mid-gap ratio as a function of the filling ratio, and forming the second voids to achieve a desired gap/mid-gap ratio.

36. The photonic crystal product of claim 34, wherein the process includes empirically determining a gap/mid-gap ratio as a function of the filling ratio, and forming the second voids to achieve a desired gap/mid-gap ratio.

37. The photonic crystal product of claim 29, wherein the process is carried out in the order presented.

38. A three-dimensional complete bandgap photonic crystal product formed by the process comprising:

providing a substrate having a refractive index of 2 or greater for a select wavelength;

forming in the substrate a first periodic array of first voids from unit cells connected by imaginary bonds, wherein the first periodic array has an incomplete bandgap for the select wavelength, and wherein the first voids are completely separated from each other by a first portion of the substrate; and forming a second periodic array of second voids, wherein the second voids are arranged at least one each along each of the imaginary bonds so as to form the complete bandgap at the select wavelength, and wherein the second voids are completely separated from each other by a second portion of the substrate and completely separated from the first voids by a third portion of the substrate.

39. The photonic crystal product of claim 38, wherein the process includes forming the first and second voids by surface transformation.

40. The photonic crystal product of claim 39, wherein the process includes forming the first voids to be spherical.

41. The photonic crystal product of claim 40, wherein the process includes forming the second voids to be spherical.

42. The photonic crystal product of claim 41, wherein the process includes forming the unit cells of the first periodic array to be diamond unit cells.

43. A method of forming a three-dimensional complete bandgap photonic crystal, comprising:

forming a periodic array of unit cells in a substrate, wherein each unit cell consists of a plurality of first voids joined by imaginary bonds, wherein the first voids are completely separated from each other by a first portion of the substrate, and wherein the periodic array forms an incomplete bandgap; and forming one or more second voids along respective one or more of the imaginary bonds in each unit cell so as to modify the periodic array to create the complete photonic bandgap, wherein the second voids are completely separated from each other by a second portion of the substrate and completely separated from the first voids by a third portion of the substrate.

44. The method of claim 43, wherein the method includes forming the first and second voids by surface transformation.

45. The method of claim 43, wherein the method includes forming the unit cell as a diamond unit cell.

46. The method of claim 43, wherein the method includes forming the first voids as spherical voids.

47. The method of claim 46, wherein the method includes forming the second voids as spherical voids.

48. The method of claim 47, wherein the method includes forming the first and second voids to be substantially the same size.

49. The method of claim 43, wherein the method includes forming the second spherical voids such that two or more second spherical voids lie along each imaginary bond.

50. The method of claim 43, wherein the method includes providing a substrate made of a material selected from the group of materials consisting of a liner optical material, a non-linear optical material, a metal, a semiconductor, an insulator, a dielectric, an acoustic material, a magnetic material, a ferroelectric material, a piezoelectric material, and a superconducting material.

51. The method of claim 43, wherein the method includes forming a single one of the second voids halfway between each of the first voids in the unit cell.

52. A complete bandgap 3D photonic crystal, comprising:
- a first periodic array of unit cells formed in a substrate from first voids connected by imaginary bonds, wherein the first voids are completely separated from each other by a first portion of the substrate, and wherein the first periodic array alone forms an incomplete bandgap; and
- a second periodic array of second voids, wherein the second voids are completely separated from each other by a second portion of the substrate, wherein each second void is arranged along one of the imaginary bonds for modifying each unit cell to form a complete photonic bandgap.

53. The photonic crystal of claim 52, wherein the unit cell is a diamond unit cell.

54. The photonic crystal of claim 52, wherein the first voids are spherical.

55. The photonic crystal of claim 54, wherein the second voids are spherical.

56. The photonic crystal of claim 52, wherein the first and second voids are substantially the same size.

57. The photonic crystal of claim 52, wherein a single second void is arranged halfway between the first voids in the unit cell.

58. The photonic crystal of claim 52, wherein two or more of the second spherical voids lie along each imaginary bond.

* * * * *

UNITED STATES PATENT AND TRADEMARK OFFICE
CERTIFICATE OF CORRECTION

PATENT NO. : 7,018,467 B2  Page 1 of 1
APPLICATION NO. : 10/053003
DATED : March 28, 2006
INVENTOR(S) : Geusic et al.

It is certified that error appears in the above-identified patent and that said Letters Patent is hereby corrected as shown below:

TITLE PAGE, ITEM (56), under "Foreign Patent Documents", in column 2, line 1, after "8/2000" insert - - G02B/5/20 - -.

TITLE PAGE, ITEM (56), under "Foreign Patent Documents", in column 2, line 2, after "3/2001" insert - - G02B/6/12 - -.

TITLE PAGE, ITEM (56), under "Foreign Patent Documents", in column 2, line 3, after "4/2001" insert - - H01L/21/3065 - -.

TITLE PAGE, ITEM (56), under "Foreign Patent Documents", in column 2, line 4, after "8/1998" insert - - G02B/6/138 - -.

TITLE PAGE, ITEM (56), under "Other Publications", in column 2, lines 1-2, delete "i nCertin" and insert - - in Certain - -, therefor.

TITLE PAGE, ITEM (56), under "Other Publications", in column 2, line 5, delete "THree" and insert - - Three - -, therefor.

TITLE PAGE, ITEM (56), under "Other Publications", in column 2, line 14, delete "sperical" and insert - - spherical - -, therefor.

In column 10, line 9, in Claim 11, after "voids" delete "arc" and insert - - are - -, therefor.

In column 12, line 63, in Claim 50, delete "liner" and insert - - linear - -, therefor.

Signed and Sealed this

Eighth Day of August, 2006

JON W. DUDAS
*Director of the United States Patent and Trademark Office*